(12) United States Patent
Agarwal et al.

(10) Patent No.: US 7,592,835 B2
(45) Date of Patent: Sep. 22, 2009

(54) CO-PROCESSOR HAVING CONFIGURABLE LOGIC BLOCKS

(75) Inventors: Amit Agarwal, Hillsboro, OR (US);
Sanu K. Mathew, Hillsboro, OR (US);
Ram K. Krishnamurthy, Portland, OR (US); Rajaraman Ramanarayanan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/966,307

(22) Filed: Dec. 28, 2007

(65) Prior Publication Data

US 2009/0167351 A1    Jul. 2, 2009

(51) Int. Cl.
*H01L 25/00* (2006.01)

(52) U.S. Cl. .................. 326/41; 708/270; 708/505; 708/670; 326/38

(58) Field of Classification Search ............. 326/37–41, 326/47, 53; 708/501, 503, 505, 523, 524, 708/607, 620, 670, 708–713, 7, 8, 235, 270, 708/502, 504, 507–508, 603, 604, 623–632, 708/650–656; 716/16
See application file for complete search history.

(56) References Cited

U.S. PATENT DOCUMENTS

| 6,021,423 | A  | * | 2/2000 | Nag et al. ................... 708/622 |
| 6,888,372 | B1 | * | 5/2005 | Hazanchuk ................... 326/39 |
| 7,167,022 | B1 | * | 1/2007 | Schleicher et al. ............. 326/41 |
| 7,394,287 | B1 | * | 7/2008 | Hutton ......................... 326/38 |
| 2003/0135332 | A1 | * | 7/2003 | Shackleford ................. 702/20 |

* cited by examiner

*Primary Examiner*—James Cho
*Assistant Examiner*—Jany Tran
(74) *Attorney, Agent, or Firm*—KED & Associates, LLP

(57) ABSTRACT

A co-processor system is provided that includes an array of configurable logic blocks (CLBs). Each CLB including a plurality of look-up tables and a plurality of adders. Each CLB may be dynamically reconfigurable to perform a plurality of logical functions.

19 Claims, 4 Drawing Sheets

CO-PROCESSOR HAVING CONFIGURABLE LOGIC BLOCKS

BACKGROUND

1. Field

Embodiments of present invention may relate to a co-processor system having configurable logic blocks.

2. Background

Modern computer-based multimedia applications, such as video, graphics and audio processing, may include computationally intensive data processing. This data processing may require millions of additions/multiplications per second to ensure real-time performance of the multimedia applications.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
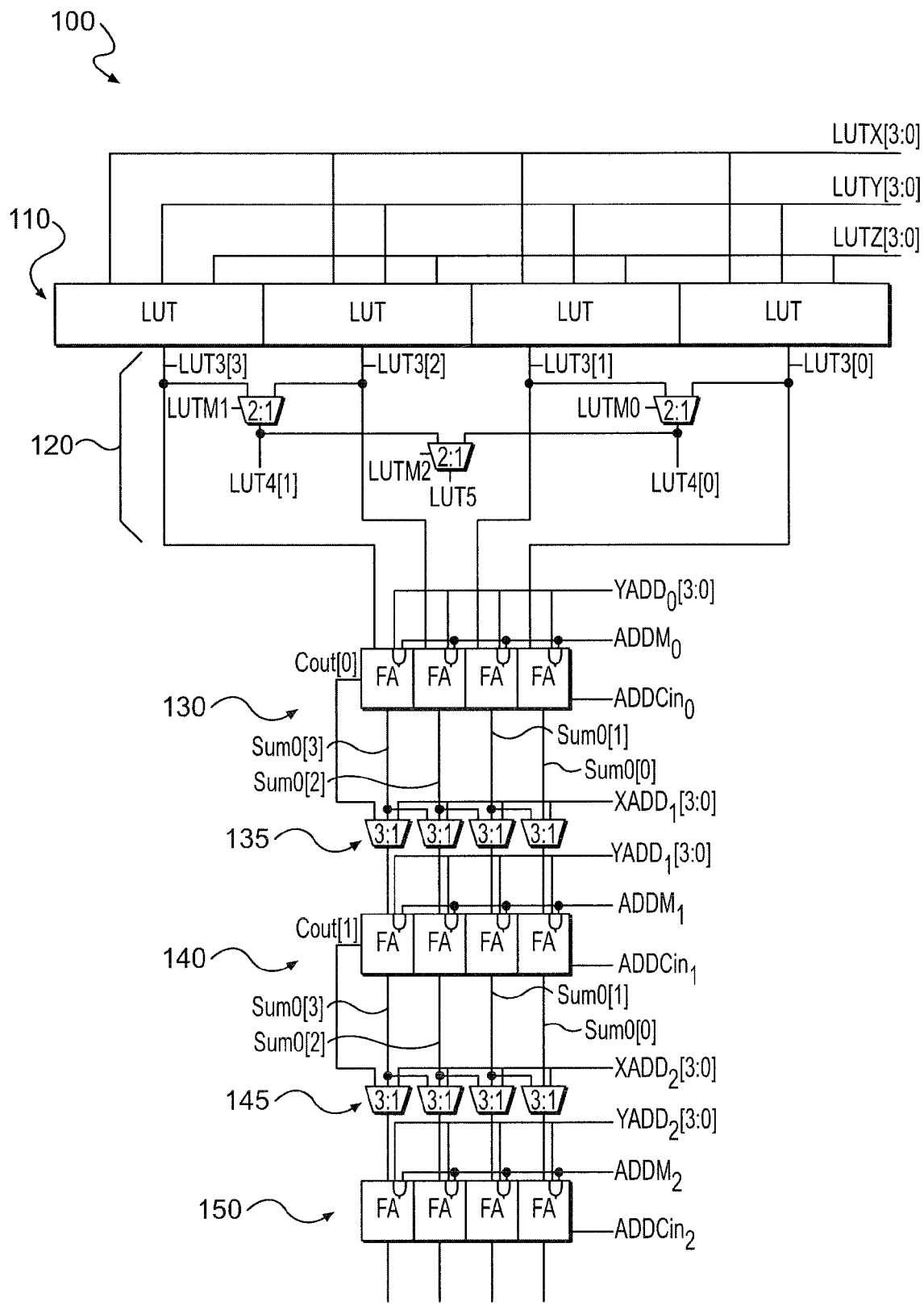
FIG. 1 shows a data path of a configuration logic block (CLB) in accordance with an example embodiment of the present invention.

Field-programmable gate arrays (FPGAs) may be semiconductor devices containing programmable logic components called "logic blocks" and programmable interconnects. Logic blocks may be programmed to perform functions or operations of basic logic gates, such as AND, XOR, or more complex combinational functions, such as decoders or simple mathematical functions.

FPGAs may include an ability to re-program so as to fix bugs and lower non-recurring engineering costs. Thus, vendors may sell less flexible versions of their FPGAs at a lower cost. Such designs may be developed on regular FPGAs and then migrated into a fixed version that more resembles an application-specific integrated circuit (ASIC). However, FPGAs may be slower than ASIC counterparts as FPGAs may not be able to handle complex designs and may draw more power.

FPGA designs may have very fine grained configuration logic blocks (CLBs) to implement logic functions. For example, CLBs may be configured to do any 4 or 5 input logic functions, distributed memory and shift registers. However, configuring such FPGA's for media accelerators may result in large performance or power overhead or a waste of resources (or area overhead).

Embodiments of the present invention may provide a co-processor system (or co-processor) for processing applications. The co-processor system may include an array of configurable logic blocks (CLBs) or configurable circuits. Each CLB may be dynamically reconfigurable thereby facilitating performance of various logical functions and expediting a critical block of the applications. The co-processor system may be provided on a die and may be integrated with another processor, such as a general purpose processor.

The CLB may include a plurality of look-up tables (LUTs) and a plurality of adders (or adder circuits). As one example, the CLB may include three 4-bit adders (or multiple-bit adders). A hybrid compressor and full adder system having an integrated partial product generation may be provided. The partial product generation may be implemented in the adder without increasing a critical path delay.

The co-processor may be a standalone chip or integrable with microprocessors to enable flexible energy-efficient media workload accelerators. The co-processor system may be built with an array of CLBs. Each CLB may be dynamically reconfigurable to implement a special-purpose hardware accelerator that speeds up a critical building block of multimedia applications, for example. This may improve energy-efficiency of the co-processor system. The CLB of the co-processor system may be built around a flexible implementation of adders and multipliers.

Since different applications handle operands of different bit-widths, the CLB may include adders and lookup tables (LUT) that may be reconfigurable to do various bit-width functions, such as serial and parallel adders, multiplier, accumulate operation and random logic functions.

Additionally, programmable interconnections may be provided between the CLBs to enable larger functions, such as fast Fourier transform (FFT) butterflies, n-point digital filters, and the like.

FIG. 1 shows a data path of a configuration logic block (CLB) in accordance with an example embodiment of the present invention. Other embodiments and configurations are also within the scope of the present invention.

More specifically, FIG. 1 shows a CLB 100 that includes four look-up-tables (or LUT) 110, a first plurality of multiplexers (or MUX) 120, three 4-bit adders 130, 140 and 150, a second plurality of multiplexers 135 and a third plurality of multiplexers 145. Other numbers of look-up tables, multiplexers and adders are also within the scope of the present invention.

Each of the four LUTs 110 may be implemented as a 3-input LUT that receives 3 inputs. Each of three inputs of a LUT may be a 4-bit word that is also applied to the other LUTs as inputs. FIG. 1 shows the three 4-bit words named LUTX [3:0], LUTY [3:0] and LUTZ [3:0]. Each LUT may be considered a multiple input LUT Outputs of the LUTs 110 may be applied to the first multiplexers 120 and to inputs of the first 4-bit adder 130. The multiplexers 120 may be 2:1 multiplexers. Inputs of the multiplexers 120 may be respectively coupled to outputs LUT3 of the LUTs 110. The multiplexers multiplex outputs of the LUTs.

The first adder 130 may be a 4-bit ripple carry adder that produces a sum and carry value. More specifically, the 4-bit adder 130 may include four 1-bit full adders (FA) each to receive a pair of common 4-bit inputs YADD0 [3:0] and ADDM0. An input carry $ADDC_{IN0}$ in may be input to one of the FAs. Outputs of the FAs may be provided to the multiplexers 135 as shown in FIG. 1. A carry out $C_{OUT[0]}$ may be output from one of the FAs and provided to one of the multiplexers 135.

As shown in the FIG. 1, reconfigurable carry signals, namely $ADDC_{IN0}$, $ADDC_{IN1}$, $ADDC_{IN2}$, $C_{OUT0}$, $C_{OUT1}$ and $C_{OUT2}$, may enable various configurations for multiplication, serial and parallel additions and accumulation. The 3:1 multiplexers 135 and 145 at inputs of the adders 140 and 150 may provide a 1-bit right-shift of an operand to impart correct significance to partial products generated during array multiplication.

The multiplexers 135 may be 3:1 multiplexers, for example. An input of each of the multiplexers 135 may be coupled to a corresponding sum output SUM0 of the adder 130, and to receive input XADD1. Outputs of the multiplexers 135 may be provided to the adder 140.

The 4-bit adder 140 may be a 4-bit ripple carry adder that produces a sum and carry value. More specifically, the 4-bit adder 140 may include four 1-bit full adders (FA) each to receive of a pair of common 4-bit inputs YADD1 [3:0] and ADDM1. An input carry in $ADDC_{IN0}$ may be input to one of the FAs. Outputs of the FAs may be provided to the multiplexers 145 as shown in FIG. 1. A carry out $C_{OUT[1]}$ may be output from one of the FAs and provided to one of the multiplexers 145.

The multiplexer 145 may be 3:1 multiplexer, for example. An input of each of the multiplexers 145 may be coupled to a corresponding sum output SUM1 of the adder 150, and to receive an input $XADD_2$ [3:0]. Outputs of the multiplexers 145 may be provided to the adder 150.

The 4-bit adder 150 may be a 4-bit ripple carry adder that produces a sum and carry value. More specifically, the 4-bit adder 150 may include four 1-bit full adders (FA) each to receive a pair of common 4-bit inputs YADD2 [3:0] and ADDM2. An input carry in $ADD_{CIN2}$ may be input to one of the FAs. The 4-bit adder 150 may provide 4 output bits.

As shown in FIG. 1, outputs LUT3[0], LUT3[1], LUT3[2] and LUT3[3] of the four 3-input LUTs 110 may be multiplexed together to generate two 4-input logic functions LUT4 [0] and LUT4 [1] and one 5-input logic function LUT5.

The CLB 100 may have resources to be configured as one 4-bit array multiplier 4*4. In such configurations, the four 3-input LUTS 110 may be configured to generate a first partial product. The second, third and fourth partial products may be generated by the three 4-bit adders 130, 140 and 150. The three 4-bit adders 130, 140 and 150 may be used to add the first, second, third and fourth partial products.

The CLB 100 may be reconfigurable to perform one or more logical functions. For example, the CLB 100 may be configured to perform four 3-input logical functions. The CLB 100 may also be configured to perform two 4-input logical functions. Additionally, the CLB 100 may be configured to perform one 5-input logical function.

The CLB 100 may be configured to perform as three 4+4 adders. Even further, the CLB 100 may be configured to perform as an 8+8 adder and a 4+4 adder. The CLB 100 may also be configured to perform as a 12+12 adder. The CLB 100 may also be configured to perform as a four-way 4-bit accumulator.

The CLB may reconfigure from a first logical function to a second logical function based on data stored in the LUTs.

Figure 2:
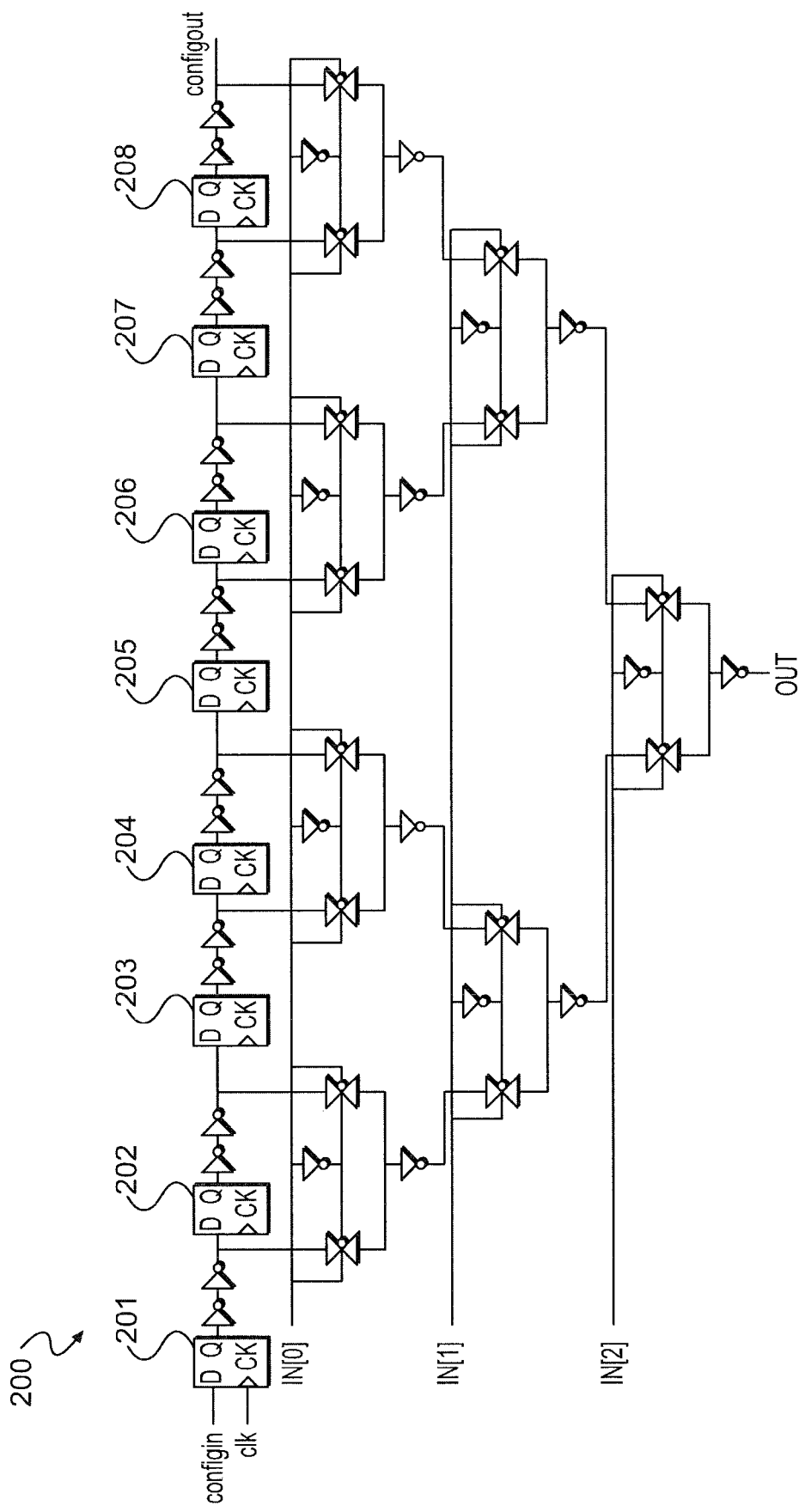
FIG. 2 shows a self decoded 3-bit input look-up table (LUT) in accordance with an example embodiment of the present invention.

FIG. 2 shows a self decoded 3-bit input LUT in accordance with an example embodiment of the present invention. Other embodiments and configurations are also within the scope of the present invention.

A self decoded 3-bit input LUT may be implemented and configured using an 8-deep scan-chain programmed with values of a truth table along with a static 8:1 multiplexer that selects an output bit (OUT) using a self-decoded 3-bit input. The self decoded array structure may eliminate or reduce a need for a separate decoder, thereby significantly improving performance and area.

FIG. 2 shows a LUT 200 that corresponds to one of the LUTs 110 from FIG. 1. More specifically, FIG. 2 shows that the LUT 200 may include a plurality of flip-flops 201-208 (or configurable flops) that may each store a particular value. Each flip-flop may store a value based on a desired logical value of the CLB. FIG. 2 shows eight flip-flops 201-208 corresponding to eight bits, although other numbers of bits may be provided. The eight flip-flops 201-208 correspond to the 8-deep scan-chain. The flip-flops 201-208 may be D/Q flip-flops, for example. The LUT 200 also shows an arrangement of inverters and transmission gates that operate as a multiplexer structure. Based on the data within the flip-flops 201-208, the LUT 208 may act as any type of three input gate.

The LUT 200 operates such that based on the 3-bit inputs IN[0], IN[1] and IN[2] and the values stored in the flip-flops 201-208, a specific output OUT may be provided from the LUT 200. Stated differently, depending on the stored values in the flip-flops (so as to correspond to a particular function), different kinds of gates may be represented by the LUT 200.

A scan-chain refers to a technique used in Design for Test to provide an easier way to set and observe every flip-flop in an integrated circuit (IC). Every flip-flop in the design may be coupled into a long shift register, where one input pin may provide data to the chain, and one output pin may be coupled to the output of the chain. Then using a chip's clock signal, a pattern may be entered into a chain of flips flops and/or a state of every flip-flop may be read out.

Figure 3:
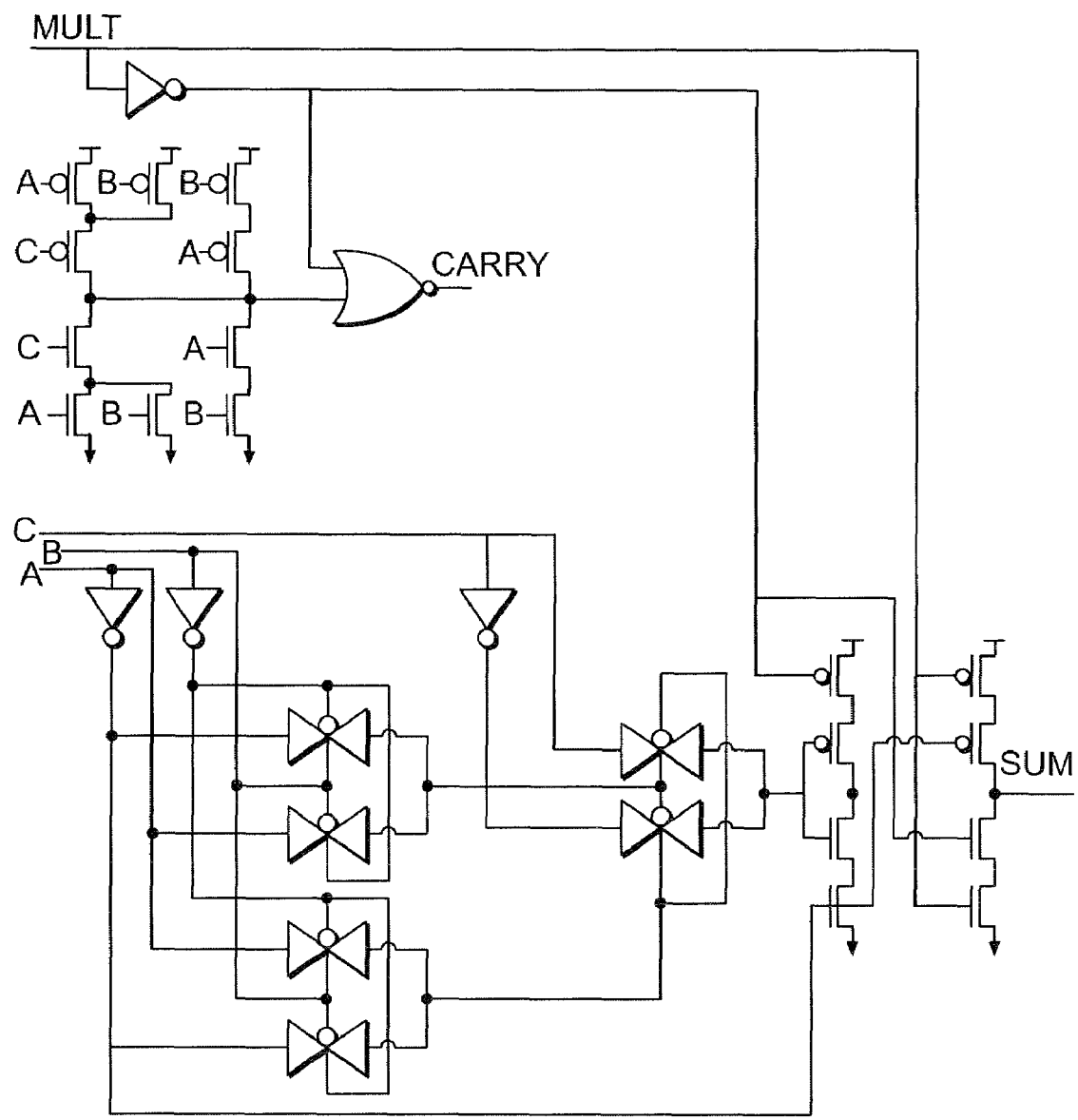
FIG. 3 shows a hybrid compressor and full adder circuit having an integrated partial product generation in accordance with an example embodiment of the present invention.

FIG. 3 shows a hybrid compressor and full adder circuit having an integrated partial product generation in accordance with an example embodiment of the present invention. Other embodiments and configurations are also within the scope of the present invention. The circuit shown in FIG. 3 may correspond to a 1 bit full adder (FA) as shown in FIG. 1.

More specifically, FIG. 3 shows a hybrid compressor full adder circuit 300 having an integrated partial product generation. The circuit 300 shows a configuration of transistors, inverters, transmission gates and a NOR gate. The circuit operates by receiving an input MULT and inputs A, B and C. Then based on the inputs, the outputs CARRY and SUM may be provided.

In certain embodiments, the CLB 100, as shown in the FIG. 1, may have enough resources to be configured as one 4-bit array multiplier. In this configuration, the four LUTs 110 shown in FIG. 1 may be respectively configured to generate a first partial product. The remaining three partial products (i.e., the second, third and fourth partial products) may be generated inside the three 4-bit adders 130, 140 and 150. The three 4-bit adders 130, 140 and 150 may be used to add the four partial products.

The input MULT may be forced to logical "1" in all configurations except a 4*4 multiplier mode. Thus, when the input MULT is logical "1", the full adder 300 may act as a full adder and (CARRY, SUM)=A+B+C (or a sum of the inputs A, B and C).

In the multiplier mode, the input MULT may be connected to the second input (multiplier) and may be logical "0" or logical "1", producing partial products and adding it with the other partial product. When the input MULT is a logical "0" then the outputs CARRY and SUM may both be a logical "0" (or CARRY="0" and SUM="0") and when the input MULT is a logical "1" then (CARRY, SUM)=A+B+C.

Accordingly, in certain embodiments, to minimize a number of inputs going in and outputs coming out of the CLB 100, the inputs and outputs of different configurations may be shared. For example, the following Table 1 shows different CLB input assignments for the different configurations identified on the top row of Table 1. Additionally, the following Table 2 shows different CLB output configurations for the different configurations identified on the top row of Table 2.

TABLE 1

| INPUT ASSIGNMENTS | CONFIGURATIONS | | | | |
| --- | --- | --- | --- | --- | --- |
|  | 3 × (4 + 4) | 4 * 4 | 4 + 4 + 4 + 4 | LUT + 2 × (4 + 4) | MUX |
| LUTX[3:0] | X0[3:0] | X0[3:0] | X0[3:0] | X0[3:0] | — |
| LUTY[3:0] | 1 | Y0[0, 0, 0, 0] | 1 | Y2[3:0] | 2:1 MUX |
| LUTZ[3:0] | 1 | 1 | 1 | X2[3:0] | NAND |
| LUTM0 | X | X | X | C0 | — |
| LUTM1 | X | X | X | C1 | — |
| LUTM2 | X | X | X | C2 | — |
| YADD0[3:0] | Y0[3:0] | X0[3:0] | Y0[3:0] | Y0[3:0] | 2:1 |
| YADD1[3:0] | Y1[3:0] | X0[3:0] | Y1[3:0] | Y1[3:0] | 2:1 |
| YADD2[3:0] | Y2[3:0] | X0[3:0] | Y2[3:0] | X | 2:1 |
| XADD1[3:0] | X1[3:0] | X | X | X1[3:0] | — |
| XADD2[3:0] | X2[3:0] | X | X | X | — |
| ADDM0 | 1 | Y0[1] | 1 | 1 | NAND |
| ADDM1 | 1 | Y0[2] | 1 | 1 | NAND |
| ADDM2 | 1 | Y0[3] | 1 | 1 | NAND |
| ADDC0 | C0 | 0 | C0 | 0 | NOR |
| ADDC1 | C1 + COUT[0] | 0 | C1 | 0 | NOR |
| ADDC2 | C2 + COUT[1] | 0 | C2 | 0 | NOR |

TABLE 2

| OUTPUT ASSIGNMENTS | CONFIGURATIONS | | | | |
| --- | --- | --- | --- | --- | --- |
|  | 3 × (4 + 4) | 4 * 4 | 4 + 4 + 4 + 4 | LUT + 2 × (4 + 4) | MUX |
| OUTX[3:0] | SUM0[3:0] | X | SUM0[3:0] | SUM0[3:0] | — |
| OUTY[3:0] | SUM1[3:0] | SUM2[0], SUM1[0] SUM0[0], LUT3[0] | SUM1[3:0] | SUM1[3:0] | 2:1 MUX |
| OUTZ[3:0] | SUM2[3:0] | COUT[2], SUM2[3:1] | SUM2[3:0] | LUT3[3:0] | 3:1 MUX |
| OUTC[2:0] | COUT[2:0] | X | COUT[2:0] | LUT5, COUT1, COUT0 | 2:1 MUX |
| OUTL[1:0] | X | X | X | LUT4[1:0] | — |

The CLB may have 10 configuration bits, for example, that reconfigure the input/output multiplexers and route the carry signals between each 4-bit adder to achieve the required mode of operation and enable maximum input/output sharing. These 10 configuration bits may be designed using 10 flip-flops connected as 10-deep scan chain. This 10-deep scan chain and four 8-deep scan-chain corresponding to 4 LUTS may be connected together. These scan chains may be loaded in a serial or a parallel manner with configuration bits to reconfigure the CLB. This reconfiguration may be performed during configuration time before execution of a reconfigured function. This may be a one time configuration overhead after which the reconfigured function can be executed multiple times.

The CLB (on a processor or die) may have a plurality of distinctive inputs and outputs. As one example, the CLB may have nine distinct inputs and five distinct outputs. The inputs may be labeled as X0 [3:0], Y0 [3:0], C0, X1 [3:0], Y1 [3:0], C1, X2 [3:0], Y2 [3:0] and C2. The outputs may be labeled as OUTX [3:0], OUTY [3:0], OUTZ [3:0], OUTC [2:0] and OUTL [1:0].

FPGA designs may have very fine grained CLBs. For example, the CLBs may be configured to implement any 4 or 5 input logic functions, distributed memory and shift registers so as to implement any random logic functions. Configuring the FPGA's for media accelerators may result in both large performance and power overhead or waste of resources (or area overhead).

Embodiments of the present invention may provide a co-processor with the CLBs designed and implemented to optimize data path media applications. The CLBs may operate in various media processing configurations with minimal performance and power overhead as compared to special purpose hardware. In general, the granularity of the CLB may depend on the target application. The CLBs may be chosen such that the CLB enables maximum sharing and ease of programmability with minimum area overhead.

Figure 4:
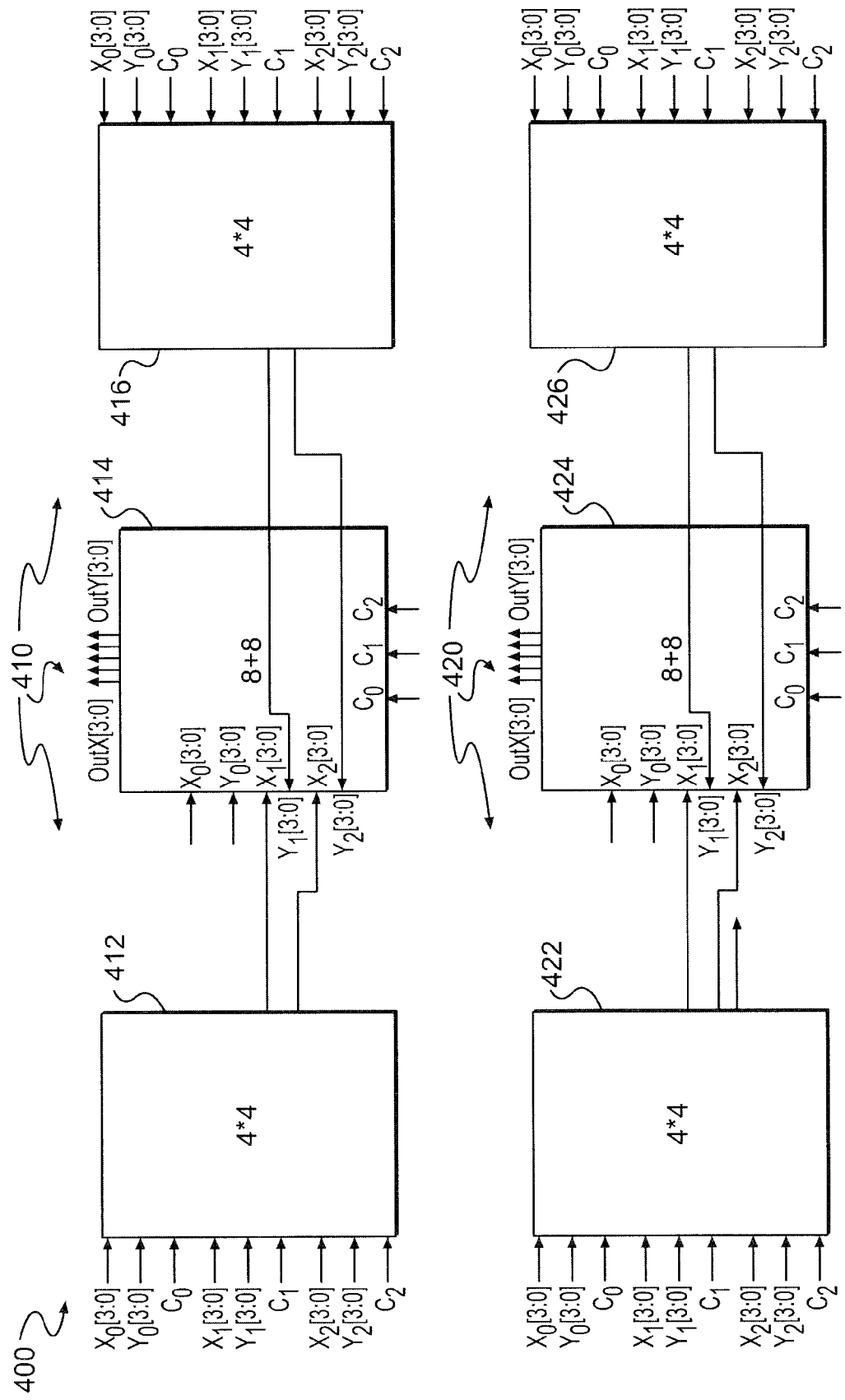
FIG. 4 shows a 3×2 array of CLBs configured to operate as a pair of parallel fast Fourier transform (FFT) butterflies in accordance with an example embodiment of the present invention.

FIG. 4 shows a 3×2 array of CLBs configured to operate as a pair of parallel FFT butterflies in accordance with an example embodiment of the present invention. Other embodiments and configurations are also within the scope of the present invention.

More specifically, FIG. 4 shows an array of CLBs (or an array 400) that may include a first circuit portion 410 and a second circuit portion 420. FIG. 4 shows a co-processor system that includes a plurality of CLBs. The first circuit portion 410 may be considered a radix-2 fast Fourier transform (FFT) butterfly circuit having 3 CLBs 412, 414 and 416. As one example, the CLB 412 may be configured as a 4*4 multiplier having outputs coupled to the CLB 414. The CLB 414 may be configured as an 8+8 adder having inputs coupled to the CLB 412 and also being coupled to the CLB 416. The CLB 416 may be configured as a 4*4 multiplier having outputs coupled to the CLB 414.

The second circuit portion 420 may be considered a radix-2 FFT butterfly circuit having CLBs 422, 424 and 426. The CLB 422 may be configured as a 4*4 multiplier having inputs as shown on the left of the CLB 422 and outputs coupled to the CLB 424. The CLB 424 may be configured as an 8+8 adder having inputs coupled to the CLB 422 and also coupled to the CLB 426. The CLB 426 may also be configured as a 4*4 multiplier having outputs coupled to the CLB 424.

A radix 2 FFT butterfly may refer to a component of several basic digital signal processing (DSP) operations, such as discrete cosine transforms, convolution and finite impulse response (FIR) filters. In the context of FFT algorithms, a butterfly may be a portion of the computation that combines results of smaller discrete Fourier transforms (DFTs) into a larger DFT, or vice versa (or breaking a larger DFT up into sub transforms).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A co-processor system comprising:
a plurality of configurable logic blocks (CLBs), each of the CLBs to reconfigure to perform a plurality of different logical functions, and each CLB including a plurality of lookup tables (LUTs), a first plurality of multiplexers to receive outputs of the LUTs, a first plurality of adders to receive outputs of the first plurality of multiplexers, a second plurality of multiplexers to receive outputs of the first plurality of adders, a second plurality of adders to receive outputs of the second plurality of multiplexers, a third plurality of multiplexers to receive outputs of the second plurality of adders, and a third plurality of adders to receive outputs of the third plurality of multiplexers.

2. The co-processor system of claim 1, wherein the plurality of lookup tables comprise a plurality of multiple-input lookup tables (LUTs) and the first plurality of adders comprise a plurality of multiple-bit adders.

3. The co-processor system of claim 1, wherein the first plurality of multiplexers to multiplex outputs of the LUTs.

4. The co-processor system of claim 1, wherein each LUT comprises a plurality of flip-flops each to store a value based on a desired logical function of one of the CLBs.

5. The co-processor system of claim 4, wherein the plurality of flip-flops are connected as a scan-chain.

6. The co-processor system of claim 5, wherein each LUT further comprises a plurality of transmission gates and inverters to operate as multiplexers.

7. The co-processor system of claim 1, wherein the plurality of LUTs to generate a first partial product.

8. The co-processor system of claim 7, wherein the first plurality of adders to generate a second partial product, the second plurality of adders to generate a third partial product, and the third plurality of adders to generate a fourth partial product.

9. The co-processor system of claim 1, wherein the system is integrated on a die.

10. A configurable logic block (CLB) comprising:
a plurality of look-up tables (LUTs) to store data based on a desired logical function of the CLB;
a first plurality of multiplexers to couple to the LUTs and to multiplex outputs of the LUTs;
a first plurality of adders to couple to the LUTs and to the first plurality of multiplexers;
a second plurality of multiplexers to couple to the first plurality of adders and to receive outputs from the first plurality of adders; and
a second plurality of adders to couple to the second plurality of multiplexers and to receive outputs from the second plurality of multiplexers, the CLB to reconfigure from a first logical function to a second logical function based on the data stored in the LUTs.

11. The CLB of claim 10, wherein each LUT comprises a plurality of flip-flops each to store a value based on the desired logical function of the CLB.

12. The CLB of claim 11, wherein the plurality of flip-flops are connected as a scan-chain.

13. The CLB of claim 12, wherein each LUT further comprises a plurality of transmission gates and inverters to operate as multiplexers.

14. The CLB of claim 10, wherein the LUTs to generate a first partial product.

15. The CLB of claim 14, wherein the first plurality of adders to generate a second partial product and the second plurality of adders to generate a third partial product.

16. The CLB of claim 10, wherein the CLB is integrated on a die.

17. The CLB of claim 10, further comprising:
a third plurality of multiplexers to couple to the second plurality of adders and to receive outputs from the second plurality of adders.

18. The CLB of claim 17, further comprising:
a third plurality of adders to couple to the third plurality of multiplexers and to receive outputs from the third plurality of multiplexers.

19. The CLB of claim 17, wherein the LUTs to generate a first partial product, the first plurality of adders to generate a second partial product, the second plurality of adders to generate a third partial product, and the third plurality of adders to generate a fourth partial product.

* * * * *